United States Patent [19]

Bosselaar

[11] 4,157,563
[45] Jun. 5, 1979

[54] SEMICONDUCTOR DEVICE

[75] Inventor: Cornelis A. Bosselaar, Nijmegen, Netherlands

[73] Assignee: U.S. Philips Corporation, New York, N.Y.

[21] Appl. No.: 555,841

[22] Filed: Mar. 6, 1975

Related U.S. Application Data

[63] Continuation of Ser. No. 425,505, Dec. 17, 1973, which is a continuation of Ser. No. 265,257, Jun. 22, 1972, abandoned.

[51] Int. Cl.² .................... H01L 29/40; H01L 27/02; H01L 29/04
[52] U.S. Cl. ........................................ 357/53; 357/28; 357/51; 357/52; 357/59; 307/303; 307/299 R
[58] Field of Search ................ 357/28, 53, 59, 51, 357/52; 307/299, 303

[56] References Cited

U.S. PATENT DOCUMENTS

| | | | |
|---|---|---|---|
| 3,405,329 | 10/1968 | Loro et al. | 357/53 |
| 3,562,608 | 2/1971 | Gallagher | 357/53 |
| 3,576,478 | 4/1971 | Watkins | 357/59 |
| 3,614,480 | 10/1971 | Berglund | 357/28 |
| 3,699,646 | 10/1972 | Vadasz | 357/59 |
| 3,728,590 | 4/1973 | Kim et al. | 357/59 |

FOREIGN PATENT DOCUMENTS

| | | | |
|---|---|---|---|
| 2031082 | 4/1971 | Fed. Rep. of Germany | 357/53 |
| 300472 | 4/1968 | Sweden | 357/53 |

Primary Examiner—Andrew J. James
Attorney, Agent, or Firm—Thomas A. Briody; Edward J. Connors, Jr.

[57] ABSTRACT

A semiconductor device having a planar p-n junction which in order to increase the breakdown voltage is shunted by a resistance layer of a very high resistance provided on an insulating layer. According to the invention, a resistance layer is used in the form of an elongate strip. The strip is preferably in the form of a coil, or a number of concentric contact layers present on the insulating layer are used which cross the resistance layer and assume the potential of the resistance layer at the area of the cross-over.

8 Claims, 6 Drawing Figures

SEMICONDUCTOR DEVICE

This is a continuation of application Ser. No. 425,505, filed Dec. 17, 1973, claiming priority order Dutch Application No. 7109130 filed July 2, 1971, which is a continuation of Ser. No. 265,257, 6/22/72, now abandoned.

The invention relates to a semiconductor device comprising a semiconductor body having a surface which is at least partly covered by an electrically insulating layer, a first region of a first conductivity type adjoining the surface and a second region of a second conductivity type likewise adjoining the surface and being surrounded entirely within the semiconductor body by the first region and forming therewith a p-n junction terminating at the surface, while in order to increase the breakdown voltage of the pn-junction, a resistance layer of a high electric resistance is present on the insulating layer, the resistance layer being separated from the p-n junction and being electrically conductively connected to the first region and to the the second region via apertures in the insulating layer, the resistance layer covering at least a part of the insulating layer between the apertures.

Semiconductor devices having a first region of a first conductivity type and a second region of a second conductivity type which is entirely surrounded by the first region and which forms with the first region a p-n junction terminating at the surface and usually covered by an insulating layer, a so-called planar junction, are known and are widely used both in discrete semiconductor circuit elements and in integrated semiconductor circuits.

In practice, however, it is found to be very difficult to give such a p-n junction a high breakdown voltage. Several causes can be given for this. First of all very high field strengths occur locally at the area of the line of intersection of the p-n junction and the surface when the p-n junction is polarized in the reverse direction. This is due inter alia to the strong curvature of the p-n junction in the proximity of the line of intersection, which curvature is stronger according as the p-n junction is nearer below the surface.

Furthermore, under the influence of the high field strength in the proximity of the p-n junction, displacement of electric charges through and across the insulating layer present on the surface may occur, which charge migration can make the p-n junction unstable and give rise to undesired leakage currents in particular at high reverse voltage.

As a result of the said problems it appears not possible in practice to manufacture stable planar p-n junctions having a breakdown voltage of more than a few hundred volts without the use of particular measures.

In order to increase the breakdown voltage of planar junctions it has been tried by several measures to reduce the electric field, in particular in the proximity of the p-n junction at a given reverse voltage, and to avoid charge migration.

For that purpose, according to a first known method, a readily conducting field electrode is provided on the insulating layer and is connected to one of the regions which form the p-n junction, for example, to the most highly doped region. Although as a result of this the field strength at the p-n junction can be reduced and/or charge migration can be checked, one of the drawbacks of this method is that the entire field electrode is at the same potential so that the full reverse voltage is applied everywhere across the insulating layer between the field electrode and the semiconductor surface, as a result of which breakdown through the insulating layer can occur.

According to another known method, further zones of the second conductivity type, which surround the second region entirely, are provided at some distance from the second region. Due to the presence of these further zones, the electric field in the depletion zone in the first region is modified such as to permit a higher breakdown voltage. One of the drawbacks of this method, however, is that extra zones are to be provided in the semiconductor body and that as a result of charge migration along or through the insulating layer, the zones increasing the breakdown voltage can be short-circuited mutually and/or with the p-n junction.

According to a third known method, a gradual variation of the field strength in the depletion zone is obtained by shunting the p-n junction by a resistance layer which is provided on the insulating layer, covers substantially the entire p-n junction and is connected in a conductive manner to the first region and to the second region via apertures in the insulating layer, and between said apertures forms a high electric resistance. As a result of this a field electrode having a gradually varying potential is obtained, with which a more favourable distribution of the field strength in the depletion zone is obtained than with a field electrode of constant potential. One of the drawbacks of this method, however, is that although some influence can be exerted on this, for example, by thickness variations of the resistance layer, the resulting field strength variation in the depletion zone is only little flexible and hence can only with difficulty be adjusted optimally for each individual case. Furthermore, in order to maintain within acceptable limits the leakage current flowing through the resistance layer that shunts the p-n junction, the layer should have a very high resistivity. However, as a result of its extension in two dimensions, the requisite resistivity is difficult to realize in a reproducible manner for many resistance materials.

It is one of the objects of the invention to provide a device in which the difficulties occurring in the described known devices are avoided or at least considerably reduced in a simple manner. Another object of the invention is to provide a device by which, within wide limits, an optimal field strength distribution in the depletion zone of the said p-n junction can be obtained at the surface while using simple and known technological processes and with a very large reproducibility, which is substantially not possible in the known devices.

The invention achieves this object can be achieved by shunting the p-n junction with a resistance layer of a very efficiently chosen shape and dimensions, in particular in the plane of the layer, combined if desired, with surface regions of the insulating layer covered by a contact layer.

Therefore a semiconductor device of the type mentioned in the preamble is characterized according to the invention in that the resistance layer is in the form of an elongate strip which is connected to at least a surface part of the insulating layer.

Since in contrast with known devices, the resistance layer used in the device according to the invention does not have the shape of a layer extending in two dimensions, but of a strip the length of which is larger, preferably very much larger, than the width, the important advantage is obtained that for the same maximum permissible leakage current through the resistance layer, the latter may have a considerably lower resistivity as a result of which the resistance layer can easily be provided in a reproducible manner.

A further very important advantage of the device according to the invention is that the strip-shaped resistance layer can be provided in a very suitable manner so that a previously chosen optimum variation of the field strength can be obtained at the surface across the depletion zone, as will be described in detail hereinafter.

Moreover, with otherwise the same overall resistance, the capacity of the strip-shaped resistance layer relative to the underlying semiconductor body is considerably smaller, which in certain circumstances may favourably influence the behaviour of the device at high frequency.

According to an important preferred embodiment, the surface part to which the resistance layer is connected is provided so that, along substantially the whole line of intersection of the p-n junction and the semiconductor surface, a line drawn normal to the line of intersection intersects the surface part.

The p-n junctions as they are used in known semiconductor circuit elements generally are strongly asymmetrically doped, as a result of which the depletion zone extends substantially entirely in the region having the lowest doping concentration. In connection herewith, the surface part of the insulating layer to which the resistance layer is connected in a conductive manner is, in this case, preferably present substantially entirely above the region having the lowest doping concentration. Advantageously, substantially the whole strip-shaped resistance layer is provided above the lowest-doped region so that the resistance layer is laterally spaced from a point above the p-n junction.

In many cases the second region of the second conductivity type which is surrounded entirely by material of the first conductivity type will be provided in the first region by doping from outside the body and will usually obtain a higher doping than the first region. In connection with the above, a preferred embodiment is therefore characterized in that the surface part to which the resistance layer is conductively connected, surrounds the second region substantially entirely.

According to an important preferred embodiment the resistance layer directly contacts substantially the whole surface part. In this case, for example, the resistance layer is provided in a coiled form. Advantageously, most of the turns and preferably all the turns of the resistance layer are present above the lowest doped region. The turns need not extend according to smooth lines; a coiled strip is to be understood to mean herein generally a strip which extends between the insulating layer apertures in the form of one or more turns extending in the same sense, each following turn being situated entirely outside the preceding turn. The turns may consist of otherwise arbitrary smoothly curved or broken straight lines, or combinations thereof. The shape of the turns will generally approximately correspond to the shape of the line of intersection of the p-n junction with the surface.

In this construction a desirable field strength distribution can be obtained in a very simple manner by choosing the mutual distance of the turns to be larger or smaller, or by causing the mutual distance of the turns to vary and cause them, for example, to increase or decrease, reckoned from the p-n junction. The width of the resistance layer may also be caused to vary, or a combination of said measures may be used.

According to another important preferred embodiment the surface part of the insulating layer to which the resistance layer is conductively connected is substantially entirely covered with a contact layer, preferably a metal layer, which crosses the resistance layer and contacts the resistance layer at the area of the cross-over.

Such a contact layer assumes in its entirety the potential of the resistance layer at the area of the cross-over and may contact the resistance layer both on the upper side and on the lower side of said layer. Preferably, there are a plurality of surface parts in the form of mutually separated strips covered by respective contact layers, each of which contact layers covering the surface parts, each crosses the resistance layer between the apertures and contacts the resistance layer there.

In this preferred embodiment the desirable field distribution can also be obtained by suitably choosing the number of contact layers, their mutual distance and their width. According to an important preferred embodiment, the mutual distance of the contact layers varies and, for example, the distance increases or decreases, reckoned from the p-n junction.

Like the turns of the coiled resistance layer in the above-mentioned preferred embodiment, most contact layers and preferably all contact layers of the above-mentioned preferred embodiment, are preferably present above the lowest doped region. The resistance layer itself may be in the form of both a straight or a curved strip.

The resistance layer may consist, for example, of a metal layer being so thin that its overall resistance is high. Advantageously, however, a semiconductor material is chosen for the resistance layer. Particularly suitable in this respect is polycrystalline silicon which can easily be provided with the required reproducibility and resistivity on the insulating layer by chemical decomposition of a silicon-containing gas.

At its ends, the resistance layer may directly adjoin the first and the second region. Preferably, however, at least one end of the strip-shaped resistance layer is connected to an electrically conducting layer, preferably a metal layer, which adjoins the semiconductor surface via an aperture in the insulating layer, which facilitates the contact between the resistance layer and the semiconductor surface. An important preferred embodiment is characterized in that the electrically conducting layer adjoins the second region and extends to above the first region over the entire line of intersection of the p-n junction with the semiconductor surface. As a result of this, a favourable field effect through the electrically conducting layer is obtained in the immediate proximity of the p-n junction.

The invention may advantageously be applied to any semiconductor device having a planar p-n junction which must be capable of withstanding high cut-off voltages. According to a very important preferred embodiment, however, the first region constitutes the collector zone and the second region constitutes the base zone of a high voltage transistor.

The invention will now be described in greater detail with reference to a few examples and the drawing, in which FIG. 1 is a diagrammatic plan view of a known semiconductor device, FIG. 2 is a diagrammatic cross-sectional view of the device shown in FIG. 1 taken on the line II—II.

Figure 1:
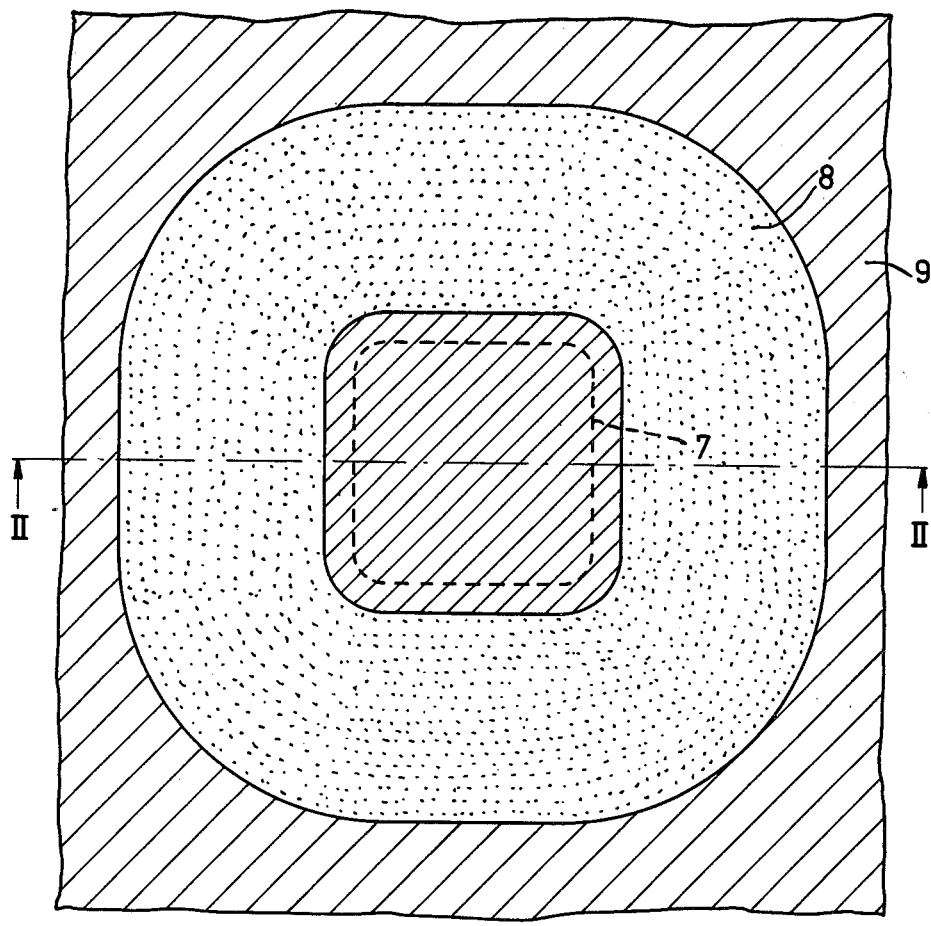
Figure 3:
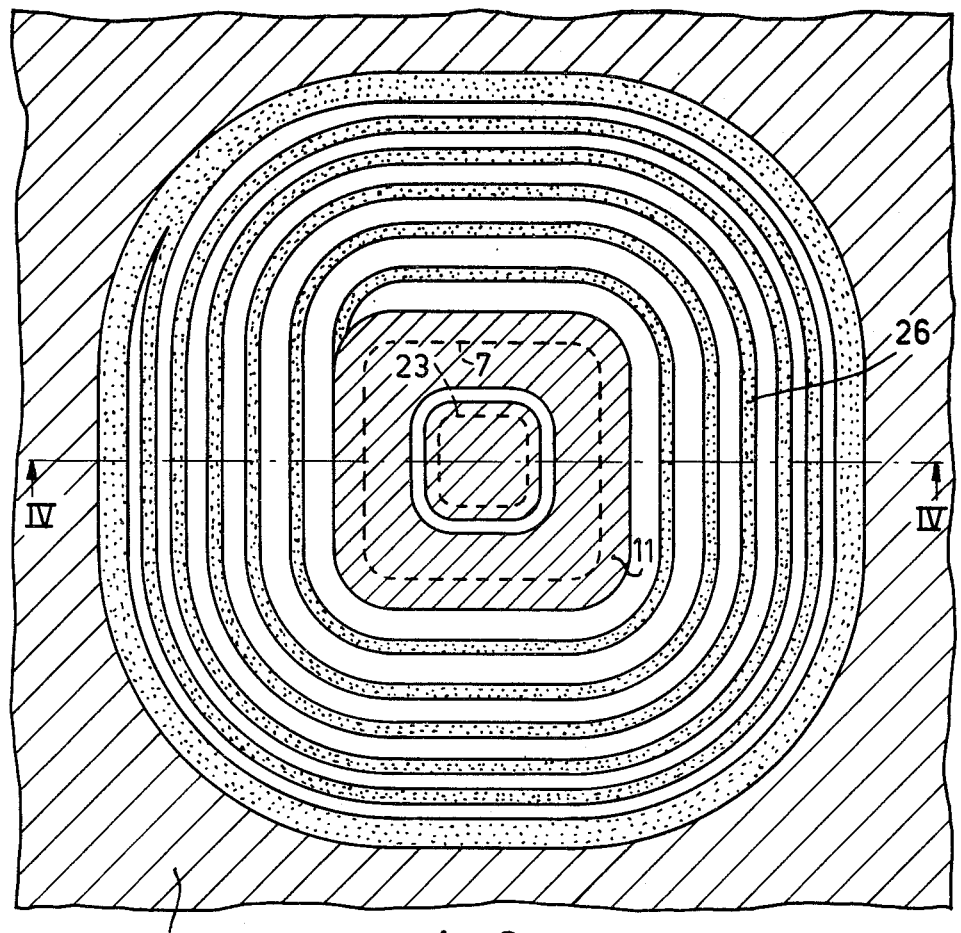
FIG. 3 is a diagrammatic plan view of a device according to the invention.
Figure 5:
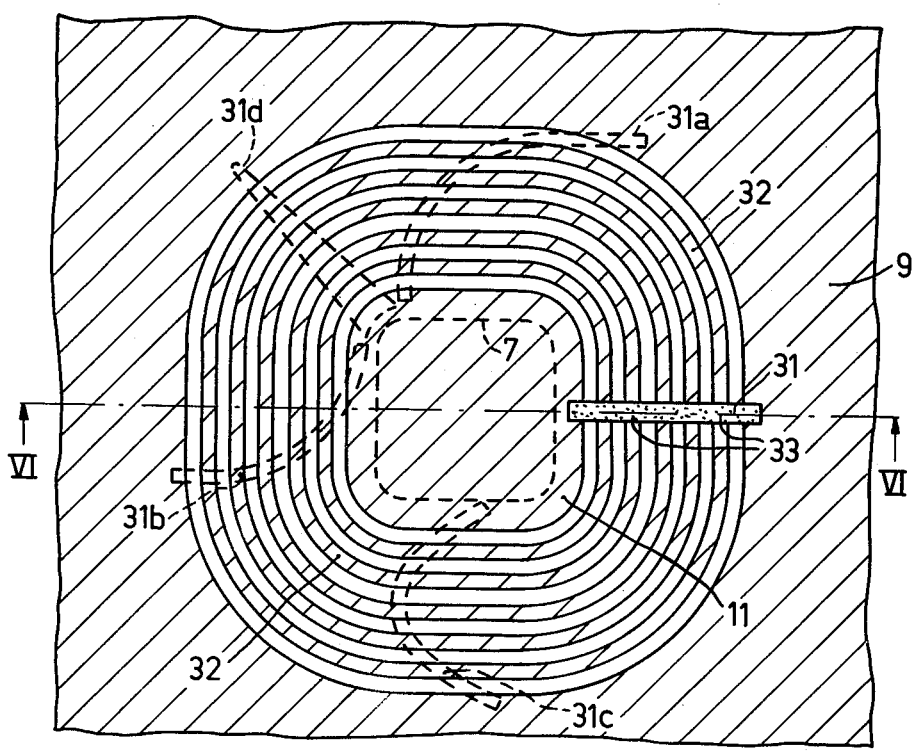
FIG. 5 is a diagrammatic plan view of another device according to the invention.

The figures, both the plan views and the cross-sectional views, are diagrammatic and are not drawn to scale. Corresponding parts in the several figures are generally referred to by the same reference numerals. Metal layers are shaded in the plan views (FIGS. 1, 3 and 5). For clarity, the various dimensions in the plan views are mutually not drawn in the correct proportion.

Figure 2:
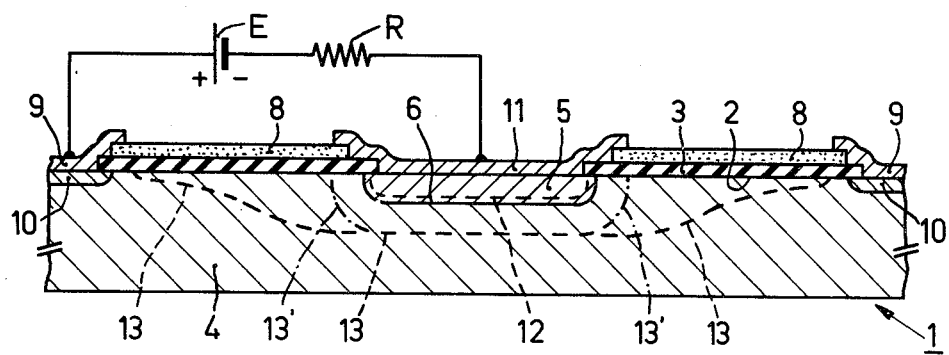

FIG. 1 is a diagrammatic plan view and FIG. 2 diagrammatic cross-sectional view of a known semiconductor device having a planar p-n junction, in this case a high voltage diode. The device (FIG. 2) has a semiconductor body 1 of silicon with a surface 2 which is covered with an electrically insulating layer 3 of silicon oxide. A first n-type region 4 having a doping concentration of $8 \times 10^{13}$ atoms/cc (resistivity 60 Ohm.cm) adjoins the surface 2. A second diffused p-type conductive region 5 is entirely surrounded within the body 1 by the first region 4 and constitutes therewith a p-n junction 6 which terminates at the surface 2 and which intersects the surface 2 according to the closed curve 7 (FIG. 1). This curve of intersection 7 is covered everywhere by the oxide layer 3.

The above-described p-n junction, a so-called planar junction, can generally not reach a breakdown voltage of more than a few hundred Volts. Inter alia as a result of the strong curvature of the p-n junction 6 at the edge of the junction in the proximity of the line of intersection 7 with the surface 2, high field strengths occur at that area upon polarising the p-n junction in the reverse direction, which field strengths limit the breakdown voltage to a few hundred volts, although the doping of the region 4, the lowest doped region, theoretically permits a much higher breakdown voltage.

Furthermore, under the influence of the high field strength through or across the oxide layer 3, displacement of electric charges may occur. Such an uncontrolled charge migration gives rise to instabilities and to uncontrolled extension of the depletion layer, which generally are very undesirable. The occurrence of these phenomena therefore reduces the permissible cut-off voltage across the p-n junction.

In the known device shown in FIGS. 1 and 2 it has been endeavoured to mitigate the above-mentioned drawbacks by shunting the p-n junction 6 by a layer 8 of polycrystalline silicon situated provided on the oxide layer 3 and having a thickness of approximately 1 micron and a high resistivity which is connected in an electrically conductive manner to the first region 4 by means of an aluminum layer 9 which adjoins the region 4 via an aperture in the oxide layer 3. In order to obtain a good contact 10 between the layer 9 and the region 4, a highly doped n-type zone 10 is diffused locally in the region 4. At the other end, the layer 8 adjoins an aluminum layer 11 which adjoins the second p-type region 5 via an aperture in he oxide layer 3.

The total resistance of the layer 8 by which the p-n junction 6 (dimensions $5 \times 5$ mm) is shunted, is in this example approximately $10^6$ Ohm and substantially determines the leakage current which is approximately 10 mA at a reverse voltage of 1000 Volts across the p-n junction. For a smaller leakage current, a proportionally higher total resistance of the resistance layer is required.

The layer 8 serves as a field electrode with continuously varying potential, as a result of which the depletion zone extends between the broken-line boundaries 12 and 13 at a given reverse voltage, applied as is shown diagrammatically in FIG. 2 by means of a voltage source E across a resistor R. Without the presence of the layer 8, the depletion zone extends between the limits 12 and 13'. It is obvious that due to the presence of the layer 8 the space charge region between the limits 12 and 13 is strongly widened at the surface, as a result of which the occurring field strengths are reduced accordingly which considerably increases the permissible reverse voltage.

A resistance layer having such a high resistivity as is used here, however, is very difficult to manufacture in a reproducible manner. Nevertheless, a considerable reproducibility is required in this case. As a matter of fact, the overall resistance of the layer 8 should, on the one hand, lie above a certain minimum value so as to maintain the leakage current within permissible limits. On the other hand, however, said resistance should not be so high as to become of the same order of magnitude as, or larger than, the natural leakage resistance of the p-n junction, since in that case the favourable influence of the layer 8 on the breakdown voltage is lost.

In this known device, the variation of the boundary 13 of the depletion zone and hence the variation of the field strength at the surface in the depletion zone can furthermore be influenced only to a limited extent, for example, by locally varying the thickness of the layer 8.

Figure 4:
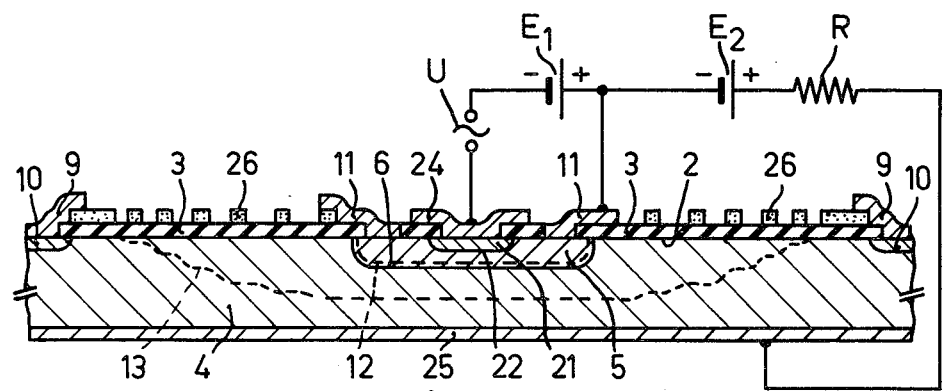
FIG. 4 is a diagrammatic cross-sectional view of the device shown in FIG. 3 taken on the line IV—IV.

In order to avoid these drawbacks entirely or at least for a considerable part, according to the invention the layer 8 is given the form of an elongate strip. FIGS. 3 and 4 show such a device according to the invention, in this example a high voltage transistor, of which the region 4 is the collector zone and the region 5 is the base zone. The regions 4 and 5 and the p-n junction 6 correspond in doping and dimensions, respectively, as in the known device shown in FIGS. 1 and 2. An n-type emitter zone 21 which forms a p-n junction 22 with the base zone 5 is provided within the p-type base zone 5, the junction 2 intersecting the semiconductor body along to a line 23. The emitter zone 21, the base zone 5 and the collector zone 4 are contacted in the usual manner via aluminum layers 24, 11, and 25.

In this example the base-collector junction 6 is shunted by a resistance layer of polycrystalline silicon in the form of an elongate 2 strip 26 which adjoins the region 5 via the aluminium layer 11 and adjoins, via an aluminium layer 9, the region 4 at a highly doped diffused n-type contact zone 10 as in FIG. 2. From where it adjoins the layer 11 the strip 26 extends like a coil, via a number of turns which surround the region 5 and cover a likewise-coiled surface part of the oxide layer 3, up to where it adjoins the layer 9. Practically, the entire resistance layer 26 with all its turns is present above the region 4 which is lower doped than the region 5.

Only a small number of turns are shown in FIG. 3 for clarity. Actually the number of turns will usually be larger and, for example, be ten or more.

It will be obvious that in the device according to the invention as described in this example, compared with the known device shown in FIGS. 1 and 2, the strip 26 may have a very much lower resistivity than the layer 8 when the overall resistance of the continuous, coherent layer 8 is the same as that of the coiled strip 26 and when both layers 8 and 26 have the same (homogeneous) layer thickness. This may become apparent from the following simple numerical example.

In a p-n junction having dimensions of 5×5 mm² and a region 4 having a doping of $8\times10^{13}$ atoms/cc, the width of the depletion zone with a reverse voltage of 1000 volts is in both cases approximately 200 microns at the surface. In order to cover the depletion zone at the surface entirely, a coiled resistance layer 10 requires turns of 10 microns wide and 10 microns intermediate space, together the length of approximately $2\times10^5$ microns. With a layer thickness of 1 micron an overall resistance of $10^6$ Ohm is achieved in this case with an average resistivity of approximately $5\times10^{-3}$ Ohm.cm. In the same case, the average resistivity of the resistance layer should be approximately $10^4$ Ohm.cm with a continuous closed resistance layer as the layer 8 of FIGS. 1 and 2, with the same layer thickness. The required resistivities in this example are thus in the proportion of 1:2,000,000.

Moreover upon providing the coiled strip 26, there exists a greater freedom in the efficient choice of the dimensions in particular of the width of the strip and of the mutual distance of the turns, as a result of which a previously calculated desired potential variation in the depletion zone can easily be adjusted. As in FIG. 2, the lines 12 and 13 denote the limits of the depletion zone with the same reverse voltage across the junction 6 as in FIG. 2. As is denoted diagrammatically in FIGS. 3 and 4, the intermediate space between the turns increases from the region 5 towards the outside in the example shown, as a result of which the potential along the surface at a large distance from the region 5 decreases more rapidly, which may be favourable in certain circumstances.

Furthermore it is obvious that the capacity of the strip 26 relative to the underlying semiconductor material (4, 5) is much smaller than that of the layer 8 in FIGS. 1 and 2.

The fact that the coiled resistance layer 26 does not influence the entire area of the insulating layer below which the depletion zone of the p-n junction is present, does not adversely influence the action of the resistance layer since the electric field effect of the coil also extends noticeably between the turns, at least when the distance between said turns is not too large. Moreover possible depressions of the potential between two turns will be compensated by charge migration along or through the oxide layer between the turns. So the charge migration between the turns is advantageously used in the invention in this respect.

Other shapes and dimensions of the coiled strip may be preferred in certain circumstances. In this connection it is pointed out that the insulating layer 3 between the turns may be covered with a material of such a high resistivity that this may be considered substantially as insulating with respect to the layer 26. For example, within the scope of the invention, such a substantially insulating semiconductor layer, for example very high ohmic polycrystalline silicon, may be deposited on the layer 3 and after local masking a strip-shaped zone in the form of a coil of the required resistivity and dimensions may be diffused in said layer over at least a part of the layer thickness.

In the device of FIGS. 3 and 4 also the metal layer 11 extends everywhere above the line of intersection 7 of the p-n junction and the surface and above the region 4, as a result of which the electric field is favourably influenced in particular in the proximity of the p-n junction at the surface.

As is shown diagrammatically in FIG. 4, the emitter-base junction 22 in the operating condition is biased in the forward direction and the base-collector junction 6 is biased in the reverse direction by means of voltage sources $E_1$ and $E_2$, an input signal U, for example, being supplied between the emitter and base and being derived in amplified form across the resistor R.

Figure 6:
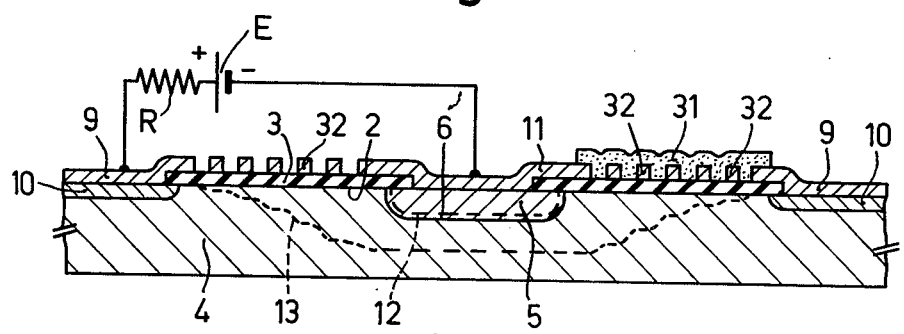
FIG. 6 is a diagrammatic cross-sectional view of the device shown in FIG. 5 taken on the line VI—VI.

However, the invention is by no means restricted to the construction of the resistance layer in the form of a coil. A different embodiment of a device according to the invention for example is shown in FIGS. 5 and 6. This device comprises a diode having a planar p-n junction 6 which as regards its semiconductor body structure is quite analogous to the diode shown in FIGS. 1 and 2 in which the zones 4 and 5 also have the same shape and doping.

In the device shown in FIGS. 5 and 6, however, the resistance layer is in the form of an elongated strip 31. This strip 31 is electrically conductively connected to number of concentric annular surface parts of the silicon oxide layer 3, which annular surface parts individually are entirely covered with a respective contact layer 32 of aluminum. Each of the contact layers 32 crosses the resistance layer 31 and adjoins the resistance layer 31 at the area of the cross-over 33.

Each contact layer 33 has the potential of the resistance layer at the area of the cross-over with the relevant contact layer. As a result of this, a potential distribution which very much resembles that of the example shown in FIGS. 3 and 4 is obtained in the depletion zone of the p-n junction 6 between the boundaries 12 and 13.

Via the aluminum layers 9 and 11 the resistance layer 31 adjoins the regions 4 and 5, a highly doped n-type zone 10 being again provided for a good contact with the region 4. As is shown diagrammatically in FIG. 6 the diode is provided with electric connections on the layers 9 and 11.

Although the strip-shaped resistance layer 31 is considerably shorter than the coiled strip of FIGS. 3 and 4, the resistivity of the strip 31 may nevertheless be considerably smaller than that of the layer 8 in the known device shown in FIGS. 1 and 2.

The desired potential distribution may in this example be obtained, in analogy with the coil turns of the example of FIGS. 3 and 4, by suitable choice of the width of the aluminium strips 32 and their mutual distance and, if desirable, causing them to increase or decrease from the region 5. Another suitable method of obtaining the desired potential distribution consists in that the resistance layer 31 is not provided transverse to but obliquely to the rings 32, or that the strip 31 is not constructed in the form of a straight strip but in the form of a curved strip as is shown in broken lines in FIG. 5. For example, with a mutually equal distance between the rings 32 and the same thickness of the resistance layer, a slower potential distribution is obtained with a strip of the shape 31a in the proximity of the p-n junction 6 than at a larger distance from the junction. With a shape of strip as shown in 31b on the contrary, the potential difference between successive rings in the proximity of the region 5 becomes larger than at some distance there-from, while with a shape of the strip as shown in 32c and taken from the region 5, first a rapid, then a slow and then again a rapid potential variation is obtained. The width of the strip 31 may also be varied; for example, with a resistance layer of the shape 31d a more rapid drop of potential can be obtained with the distance of the p-n junction increasing. Thus, it will be clear that all combinations of variations in width and intermediate space of the contact layers 32, and in width, thickness and curvature of the strip 31 may be used to obtain an optimum result in each particular case.

The device according to the invention as described in the preceding examples can be manufactured while using convention methods of making planar semiconductor structures. The region 5 may be formed by diffusion, for example from doped oxide, or differently for example, by ion implantation. The region 5 may also be obtained by epitaxial growing in a cavity previously provided in the region 4. The region 5 may be doped lower than the region 4, in which case the turns of the coil 26 and the contact layer 32, respectively, will preferably be provided on the layer 5. Conventional methods, such as vapour deposition, thermal decomposition of a gaseous compound, sputtering and so on, may also be used for providing the resistance layer (26, 31).

It will be obvious that the invention is not restricted to the examples described but that many variations are possible to those skilled in the art without departing from the scope of this invention, in which the voltage drop across a resistance layer in the form of an elongate strip is always used advantageously to increase the breakdown voltage across a p-n junction and or to eliminate the adverse results of charge migration in the vicinity of a p-n junction.

For example, in the embodiments described the contact layers 32 in the second embodiment may be interrupted in which case however, both parts of the ring must remain connected to the resistance layer. In certain cases, where the object is to counteract charge migration only over a restricted surface area, the contact layer may be replaced by short strips which cross the resistance layer 31, contact the resistance layer at the area of the cross-over, and from the crossover extend only across the said restricted surface area. Usually, however, it will be desirable in particular to make the breakdown voltage of the p-n junction as high as possible, in which case each of the surface parts of the insulating layer connected to the resistance layer will be provided, as in the example described, in such manner that along substantially the whole line of intersection of the p-n junction and the semiconductor surface a line normal to said line of intersection intersects the relevant surface parts. This configuration has for its result that the field distribution at the surface across all points of the line of intersection of the p-n junction with the surface obtains the desirable profile. The above condition is satisfied in the examples described, see FIG. 3 in which, for example, the line IV—IV, and any other line normal to the p-n junction 7, intersects the surface parts of the insulating layer 3 covered by the layer 26. In FIG. 5 also, the line VI—VI, and any other line normal to the p-n junction 7, intersects all the surface parts of the insulating layer 3 covered by the layer 32.

It is furthermore to be noted that, of course, semiconductor materials other than those mentioned in the examples may be used, for example, germanium or $A_{III}B_V$ compounds, for example, GaAs. Insulating layers other than silicon oxide, for example, silicon nitride, $Al_2O_3$, or composite layers consisting of two or more different insulating layers situated one on the other may also be used. The resistance layer may also consist of other materials with comparatively high resistivity or be composed of two or more resistance layers provided one on the other. Furthermore, one or more insulating layers may be provided across the resistance layer and across all other parts, for insulation or protection purposes. Moreover, the invention is not restricted to diodes or transistors but may also be used advantageously in, for example, thyristors or other high-voltage circuit elements.

What is claimed is:

1. A semiconductor device comprising:
    (a) a semiconductor body comprising a major surface, a first region of first conductivity type adjoining said surface, and a second region of second conductivty type adjoining said surface and having a greater doping level than said first region, said second region being substantially entirely surrounded within said semiconductor body by said first region and forming with said first region a p-n junction terminating at said surface;
    (b) an electrically insulating layer disposed at and at least partly covering said surface, said insulating layer extending across said p-n junction and comprising apertures located at said first and second regions; and
    (c) a resistance layer having an elongated strip configuration that is substantially coil-shaped and comprises a plurality of turns, at least one of said turns completely surrounding said second region, said resistance layer being of high electric resistance material and being located on said insulating layer, said resistance layer being disposed over only said first region and laterally spaced from a point located above said p-n junction and electrically connected to said first and second regions via said apertures, said resistance layer covering at least a portion of said insulating layer located between said apertures and being electrically connected to at least a surface part of said insulating layer.

2. A semiconductor device as recited in claim 1, wherein said resistance layer contacts substantially the whole of said surface part.

3. A semiconductor device as recited in claim 1, wherein the respective distances between adjacent ones of said turns vary.

4. A semiconductor device as recited in claim 1, wherein said resistance layer is of semiconductor material.

5. A semiconductor device as recited in claim 4, wherein said resistance layer is of polycrystalline silicon.

6. A semiconductor device as recited in claim 1, further comprising an electrically conducting layer disposed at one of said apertures and extending through said aperture to said semiconductor surface, at least one end of said resistance layer being electrically connected to said electrically conducting layer.

7. A semiconductor device as recited in claim 6, wherein said electrically conducting layer contacts said second region and extends to above said first region along the entire line of intersection of said p-n junction with said surface, said electrically conducting layer being spaced from said first region.

8. A semiconductor device as recited in claim 1, wherein said first region is the collector zone and said second region is the base zone of a high voltage transistor.

* * * * *

UNITED STATES PATENT AND TRADEMARK OFFICE
CERTIFICATE OF CORRECTION

PATENT NO. : 4,157,563
DATED : June 5, 1979
INVENTOR(S) : CORNELIS A. BOSSELAAR

It is certified that error appears in the above-identified patent and that said Letters Patent are hereby corrected as shown below:

On the Title Page, after Section [63], insert Section [30]

as follows:

--[30]   Foreign Application Priority Data

July 2, 1971 [NL] Netherlands....7109139--

Signed and Sealed this

Fifth Day of August 1980

[SEAL]

Attest:

SIDNEY A. DIAMOND

Attesting Officer

Commissioner of Patents and Trademarks